United States Patent [19]
Dunlop et al.

[11] Patent Number: 5,528,199
[45] Date of Patent: Jun. 18, 1996

[54] CLOSED-LOOP FREQUENCY CONTROL OF AN OSCILLATOR CIRCUIT

[75] Inventors: Alfred E. Dunlop, Murray Hill; Wilhelm C. Fischer, Westfield; Thaddeus J. Gabara, Murray Hill, all of N.J.

[73] Assignee: AT&T Corp., Murray Hill, N.J.

[21] Appl. No.: 367,401

[22] Filed: Dec. 30, 1994

[51] Int. Cl.⁶ ........................................ H03L 7/00
[52] U.S. Cl. ........................................ 331/17; 331/179
[58] Field of Search ............................ 331/17, 34, 36 C, 331/179, 177 V, 177 R; 327/155, 156, 157, 159, 144, 145

[56] References Cited

U.S. PATENT DOCUMENTS 5,036,294  7/1991  McCaslin ........................... 331/1 A
5,144,156  9/1992  Kawasaki ............................ 307/262
5,272,452  12/1993 Adachi et al. ........................ 331/17
5,343,169  8/1994  Debaty ................................ 331/17
5,349,309  9/1994  Fujii .................................. 331/17

OTHER PUBLICATIONS

T. Gabara, "Pulse Power Supply CMOS –PPS CMOS", 1994 IEEE Symposium on Low Power Electronics, San Diego, CA, Oct. 10–12, 1994, pp. 98–99.

Primary Examiner—Robert Pascal
Assistant Examiner—David Vu

[57] ABSTRACT

The output frequency of a simple low-power-dissipation oscillator circuit designed to drive PPS CMOS circuits is controlled by a closed-loop system. In response to deviations of the output frequency from a prescribed value, the system generates correction signals that are applied to an array of capacitors. In that way, capacitance is electrically added to or subtracted from a series-resonant path of the oscillator circuit, thereby to automatically establish and maintain the output frequency of the circuit at or near its prescribed value.

10 Claims, 3 Drawing Sheets

CLOSED-LOOP FREQUENCY CONTROL OF AN OSCILLATOR CIRCUIT

CROSS-REFERENCE TO RELATED APPLICATIONS

Three related commonly assigned copending U.S. patent applications referred to hereinbelow are: application Ser. No. 08/225,950, filed Apr. 8, 1994; application Ser. No. 08/355,124, filed Dec. 13, 1994; and application Ser. No. 08/348,388, filed Dec. 2, 1994.

BACKGROUND OF THE INVENTION

This invention relates to an oscillator circuit and, more particularly, to a system for electrically establishing and maintaining the output frequency of an oscillator circuit at a prescribed value.

It is known that low-power-dissipation operation of a conventional complementary metal-oxide-semiconductor (CMOS) circuit fabricated in integrated-circuit form can be achieved if the power supply lead of the circuit is ramped repetitively between VDD and VSS. During the so-called power-down phase of each ramped cycle, the state of the circuit is stored on parasitic capacitances. This quasi-static CMOS circuit technique is called PPS (pulsed power supply) CMOS and is characterized by a power dissipation property that is typically approximately an order of magnitude less than that of conventional CMOS. The technique is described in "Pulsed Power Supply CMOS—PPS CMOS" by T. J. Gabara, *Proceedings of 1994 IEEE Symposium on Low Power Electronics*, San Diego, Calif., Oct. 10–12, 1994, pages 98–99. Further, the technique is described in T. J. Gabara's copending commonly assigned U.S. patent application Ser. No. 08/225,950, filed Apr. 8, 1994, now U.S. Pat. No. 5,450,027.

In practice, an oscillator circuit designed to generate a sinusoidal waveform can be utilized to power PPS CMOS circuits. Ideally, such an oscillator circuit should be relatively simple and should itself exhibit a relatively low-power-dissipation characteristic.

A relatively simple low-power-dissipation oscillator circuit suitable for generating sine-wave signals for driving PPS CMOS circuits includes an inductor connected in series with a capacitor. In practice, the capacitor of such a series-resonant path typically comprises the effective capacitance of the CMOS circuits to be driven. [A specific illustrative oscillator circuit comprising such a series-resonant path is described in a copending commonly assigned U.S. patent application of T. J. Gabara, Ser. No. 08/355,124, filed Dec. 13, 1994.]

In a variety of important practical applications, data flow in an information processing system is designed to occur at a prescribed rate. This may be accomplished, for example, under control of signals provided by a master timing source such as a crystal oscillator. The signals generated by the crystal oscillator serve as a standard against which all operations in the system are timed.

Thus, in such an information processing system that includes PPS circuits, it is necessary that the output of the oscillator circuit that drives the PPS circuits be established and maintained in a synchronous relationship with respect to the output of the master timing source. Maintaining such a relationship is necessary to assure reliable interfacing and data flow between the PPS circuits and conventional CMOS circuits included in the system.

Establishing and maintaining a synchronous relationship between the output of a master timing source and the output of the oscillator circuit that drives PPS circuits is often in practice a difficult and challenging task. This is so for several reasons. For example, manufacturing variations inevitably occur in the value of the inductor included in the series-resonant path of the oscillator circuit. Because of this, the actual output frequency of each assembled oscillator circuit will typically vary from its prescribed value. Also, the value of the capacitor included in the series-resonant path depends on the effective capacitance of the particular chip or chips driven by the oscillator circuit. As the number and type of these driven chips changes, so too of course does the effective capacitance included in the path, whereby the output frequency of the oscillator circuit again is caused to vary from the prescribed value.

SUMMARY OF THE INVENTION

An oscillator circuit designed to drive PPS circuits comprises a resonant path that includes an inductor in series with a capacitor that is the effective capacitance of the driven circuits. In accordance with the principles of the present invention, the oscillator output appearing at a node point between the inductor and the capacitor is applied to one input of a two-input phase comparator whose other input is the output of a master timing source. Correction signals generated by the phase comparator are applied to a correction circuit whose output is connected to the node point. The correction circuit includes an array of parallel-connected capacitors. In response to correction signals, the correction circuit either electrically connects or disconnects capacitors from the node point, thereby to change the capacitance in the series-resonant path and thereby to automatically establish and maintain the output frequency of the oscillator circuit at approximately the output frequency of the master timing source.

More generally, the invention comprises a system for controlling the output frequency of an oscillator circuit that includes a resonant path having an inductor connected in series with a capacitor and having an output node point in the series path between the inductor and the capacitor. In particular, the system comprises circuitry responsive to the output of the oscillator circuit and to the output of a master timing source for generating correction signals indicative of whether the output frequency of the oscillator circuit is above or below a reference frequency determined by the output frequency of the master timing source. Additionally, the system comprises circuitry responsive to the correction signals for electrically connecting or disconnecting capacitors to the node point and in parallel with the capacitance in the series-resonant path to cause the output frequency of the oscillator circuit to track the reference frequency.

BRIEF DESCRIPTION OF THE DRAWING

A complete understanding of the present invention and of the above and other features and advantages thereof will be apparent from the detailed description below taken in conjunction with the accompanying drawing, in which.

DETAILED DESCRIPTION

Figure 1:
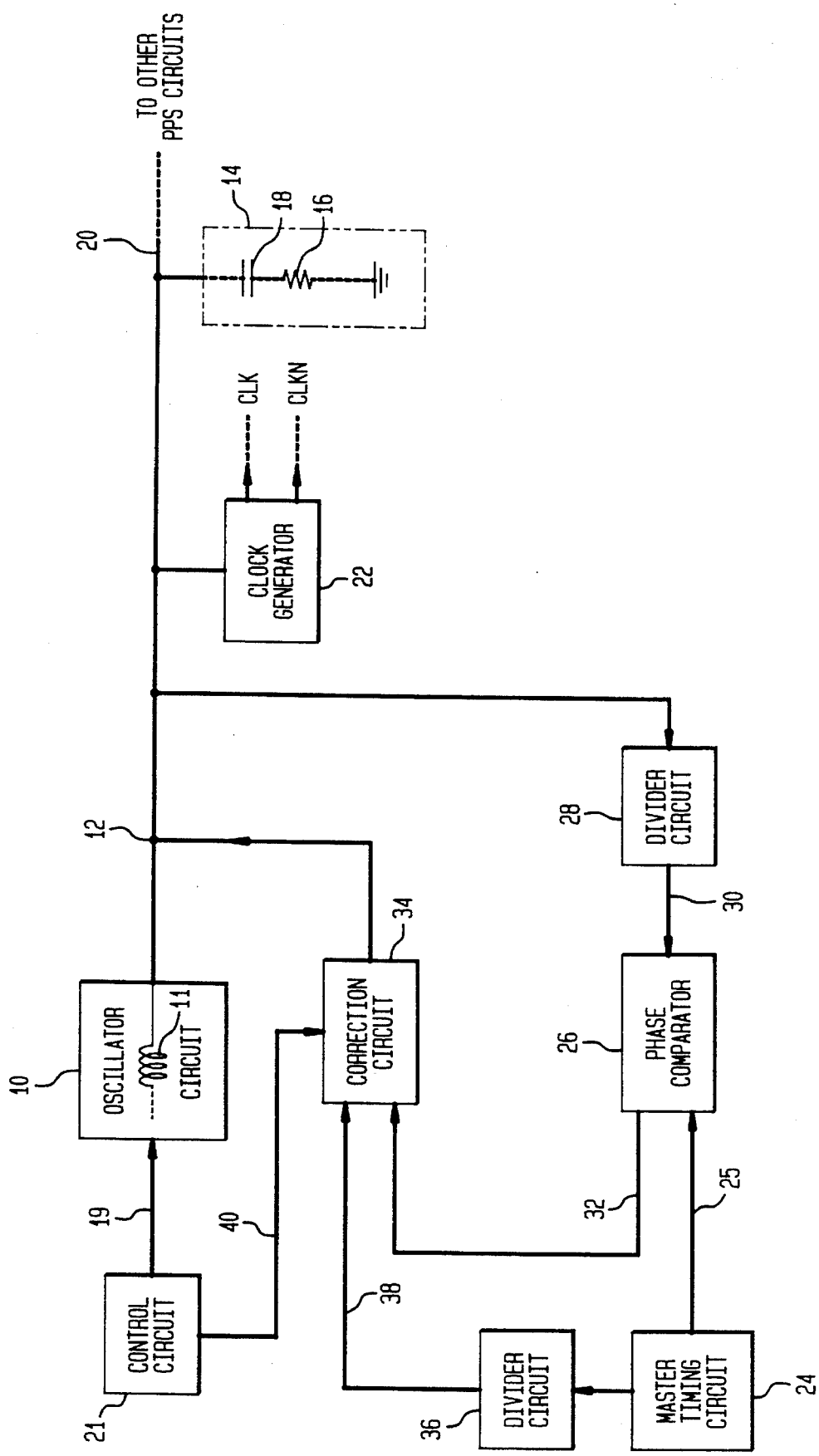
FIG. 1 is a simplified block diagram of a specific illustrative system, including a correction circuit, made in accordance with the principles of the present invention for controlling the output frequency of an oscillator circuit.

FIG. 1 shows an oscillator circuit 10 designed to provide at node point 12 a sine-wave output signal. In turn, the node point 12 is connected to a semiconductor chip 14 that includes at least some PPS CMOS integrated circuitry thereon. The equivalent circuit of the totality of the CMOS circuitry on the chip 14 driven from the node point 12 is approximated by a resistor 16 and a capacitor 18 connected in series therewith. As indicated, the bottom end of the resistor 16 is connected to a point of reference potential (ground).

Additional CMOS circuitry, including at least some PPS circuits, on other chips may also be driven from the node point 12 of FIG. 1. Lead 20 of FIG. 1 extends to such other chips.

Although the oscillator circuit 10 of FIG. 1 and its associated circuitry are in effect depicted in FIG. 1 as being separate from the chip 14 and from any additional chips that may be connected to the lead 20, it may in some cases be advantageous to include the oscillator circuit 10 (except perhaps for the relatively large inductor included therein) and its associated circuitry on the chip 14 or on one of the other chips connected to the lead 20. Or it may be more feasible to fabricate the oscillator circuit 10 and its associated circuitry on a chip or module that is separate and distinct from the driven chips.

The resonant portion of the oscillator circuit 10 of FIG. 1 comprises an inductor 11 in the block designated with the reference numeral 10 connected in series with the effective capacitor 18 on the chip 14. A variety of conventional sine-wave oscillator circuits employing such series-connected components to form a resonant path are known in the art. The inductor 11 typically has, for example, a value in the range of approximately 100-to-2000 nanoHenries (nH), and the capacitor 18 has a value in the range of about 200-to-2000 picoFarads (pF). A series-resonant circuit containing such components is designed to oscillate to provide a sine wave at a frequency in the range of about 5-to-40 megahertz (mH).

In FIG. 1, the oscillator circuit 10 is schematically shown as a self-contained block separated from the capacitor 18. This conforms with the fact that the capacitor 18 is physically spaced apart from the other components of the oscillator circuit 10. But, in view of the discussion above, it is apparent that the capacitor 18 is in effect included in and constitutes an integral portion of the series-resonant path of the oscillator circuit 10.

A specific illustrative oscillator circuit that has advantageous operating characteristics and that is suitable for use as the oscillator circuit 10 of FIG. 1 is described in the aforecited Gabara application (Case 25). The oscillator described therein is a relatively simple low-power-dissipation circuit that provides a constant-amplitude output sine wave adapted to drive PPS CMOS circuitry. To conserve power during so-called data-inactive periods, the oscillator described therein is designed to be capable of being abruptly stopped in a manner that preserves stored states in the CMOS circuitry and provides an output voltage suitable for powering conventional (non-PPS) CMOS circuitry while establishing a reliable basis for subsequently reinitiating oscillations. Illustratively, such stopping and starting of the oscillator circuit 10 of FIG. 1 is timed by signals applied to the circuit 10 via lead 19 from a conventional control circuit 21.

For the sake of completeness, the particular arrangement shown in FIG. 1 is depicted as including a clock generator 22. The generator 22 is designed to respond to sine-wave signals from the oscillator circuit 10 by providing complementary clock signals (designated in FIG. 1 as CLK and CLKN) that occur in synchronism with the output of the circuit 10. In turn, such clock signals are applied to the chip 14 and any other chips connected to the lead 20 to control data flow thereon. One particular advantageous way of generating these complementary clock signals in response to the sine-wave output of the oscillator circuit 10 is described in a copending commonly assigned U.S. patent application of W. C. Fischer and T. J. Gabara, Ser. No. 348,388 filed Dec. 2, 1994.

By way of a specific illustrative example, it will be assumed herein that for synchronous operation the oscillator circuit 10 of FIG. 1 is designed to provide an output sine-wave signal at a frequency of sixteen MHz. At that frequency, the signals generated by the circuit 10 serve to drive PPS circuits connected to the node point 12 in synchronism with the operation of the overall system of which the PPS circuits constitute a part.

The arrangement shown in FIG. 1 includes a master timing circuit 24 for generating a sine wave that constitutes a standard clock signal that controls overall system timing. Illustratively, the circuit 24 comprises a standard crystal oscillator exhibiting a high quality factor (Q) and excellent stability. The output of the circuit 24 is the standard against which the output of the oscillator circuit 10 will be measured.

In one specific illustrative example, the frequency of the output of the master timing circuit 24 is selected to be four MHz. This output is applied via lead 25 to one input of a conventional two-input phase comparator 26. The other input of the comparator 26 is a signal that is a divided-down version of the output of the oscillator circuit 10. For the illustrative case in which the output of the circuit 10 is intended to be sixteen MHz, such division is accomplished by a conventional divider circuit 28 that is set to divide the sixteen MHz signal by a factor of four, thereby to provide on lead 30 a second input to the phase comparator 26 at or about four MHz.

In one particular illustrative example, the phase comparator 26 of FIG. 1 is designed to provide a relatively positive voltage on output lead 32 whenever the frequency of the signal applied to the input lead 30 (derived from the oscillator circuit 10) exceeds the frequency of the standard or reference signal applied to the comparator 26 by the master timing circuit 24. In response to such a positive-level signal, correction circuit 34 is adapted to electrically add additional capacitance between the node point 12 and the aforementioned point of reference potential (ground). In turn, this added capacitance, which is thus in parallel with the capacitance already connected to the node point 12, causes the frequency of the oscillator circuit 10 to decrease. In time, this automatic action in the closed loop that includes the phase comparator 26 and the correction circuit 34 causes the output frequency of the oscillator circuit 10 to automatically approach sixteen MHz, in the particular manner described in detail below. In turn, the frequency-controlled output of the oscillator circuit 10 causes the generator 22 to provide complementary clock signals that are also synchronized in effect with the output of the master timing circuit 24.

Similarly, in the specified illustrative example, the phase comparator 26 of FIG. 1 is designed to provide a relatively negative voltage on output lead 32 whenever the frequency of the signal applied to the input lead 30 is less than the frequency of the reference signal applied to the comparator 26 by the master timing circuit 24. In response to such a negative-level signal, the correction circuit 34 is adapted to electrically remove capacitors that had been connected between the node point 12 and ground. In turn, removal of capacitance causes the frequency of the oscillator circuit 10 to increase. As before, this automatic action in the closed loop will in time cause the output frequency of the oscillator circuit 10 to automatically approach sixteen MHz.

Timing or clocking of the process carried out in the correction circuit 34 of FIG. 1 is controlled by signals derived from the master timing circuit 24. To conserve power, it is often advantageous to carry out the correction process at a rate that is lower than the frequency of the timing signals provided by the circuit 24. For that purpose, a standard divider circuit 36 is interposed between the circuits 24 and 34 to apply clock signals to the correction circuit 34 via lead 38 at a specified submultiple of the frequency of the signals provided by the master timing circuit 24.

Figure 2:
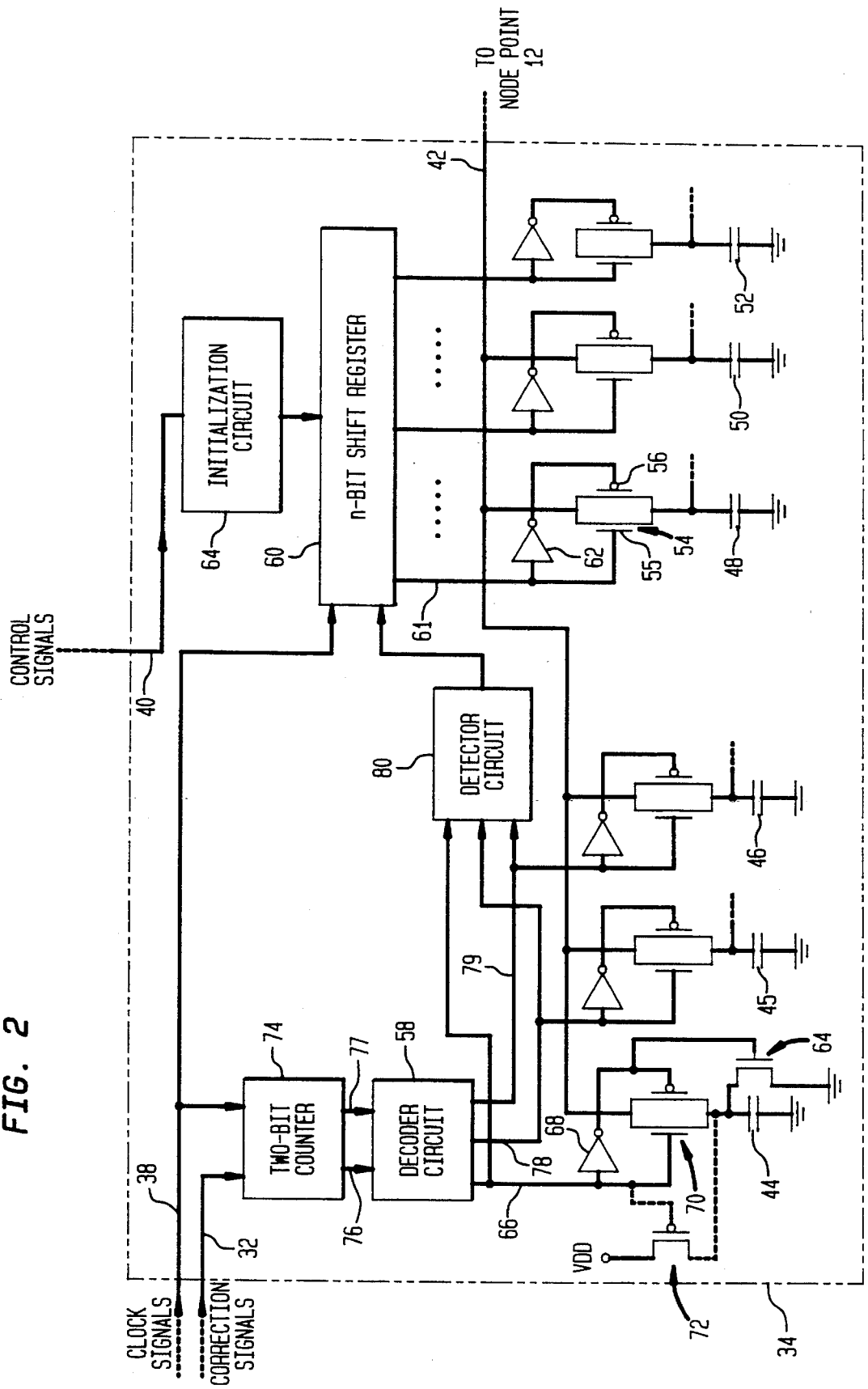
FIG. 2 is a particular illustrative representation of the correction circuit shown in FIG. 1.

FIG. 2 is a detailed schematic representation of the correction circuit 34 shown in block diagram form in FIG. 1. As in FIG. 1, the correction circuit 34 of FIG. 2 is depicted as having three inputs and one output. The inputs to the circuit 34 of FIG. 2 are: clock signals on the lead 38 from the divider circuit 36, correction signals on the lead 32 from the phase comparator 26, and control signals on the lead 40 from the circuit 21. The single output lead 42 from the correction crcuit 34 of FIG. 2 is connected to the node point 12.

The correction circuit 34 of FIG. 2 includes an array of capacitors each of which is shown as having the bottom one of its plates connected to a point of reference potential (ground) and having the other plate capable of being electrically connected or disconnected from the lead 42 which extends to the node point 12. In that way, the total amount of capacitance in, and thus the frequency of, the series-resonant path of the oscillator circuit 10 can be automatically adjusted.

The capacitor array of the correction circuit 34 of FIG. 2 is in effect divided into two sections. One section includes three capacitors 44 through 46 that comprise a so-called fine-adjustment portion of the depicted circuit. The other section includes n capacitors that comprise a so-called coarse-adjustment portion of the circuit 34. Herein, for purposes of a specific illustrative example, n will be assumed to have the value sixty-four. Only three of these sixty-four capacitors are explicitly shown in FIG. 2 wherein they are respectively designated by the reference numerals 48, 50 and 52.

By way of example, each of the capacitors 44 through 46 in the fine-adjustment section of FIG. 2 has a capacitance value of one unit, and each of the capacitors 48 . . . 50 . . . 52 in the coarse-adjustment section has a capacitance value of four units. Illustratively, for the particular example considered herein, each of the capacitors 44 through 46 is assumed to have a value of one pF, and each of the capacitors 48 . . . 50 . . . 52 has a value of four pF.

As specified earlier, the bottom plate of each of the capacitors in the depicted array of FIG. 2 is connected to ground. Further, the top plates of the capacitors are respectively connected via conventional transmission gates to the lead 42 that extends to the node point 12. Thus, whenever a particular transmission gate is activated (switched to its relatively low-resistance condition), its associated capacitor is connected to the lead 42. Similarly, whenever a particular transmission gate is deactivated (switched to its relatively high-resistance state), its associated capacitor is in effect disconnected from the lead 42. In that way, the amount of capacitance that is connected in parallel with the capacitor 18 (FIG. 1) can be electrically changed, whereby the frequency of the oscillator circuit 10 can be correspondingly controlled.

Each of the standard transmission gates represented in FIG. 2 includes an n-channel MOS transistor device and a p-channel MOS transistor device, as is well known in the art. Each of these transmission gates is schematically depicted as a box having the gate electrode of an n-channel device on the left-hand side of the box and the gate electrode of a p-channel device on the right-hand side of the box. For a low-resistance path to be established from the top lead entering the box to the bottom lead leaving the box, both devices of the gate must be activated.

Thus, for example, considering the transmission gate 54 connected to the capacitor 48 of FIG. 2, it is seen that the gate 54 is schematically represented as including the gate electrode 55 of an n-channel device and the gate electrode 56 of a p-channel device. Herein, to activate the transmission gate 54, it will be assumed for illustrative purposes that a relatively positive direct-current voltage such as VDD (for example, +5 volts) must be applied to the gate electrode 55 while at the same time a relatively negative direct-current voltage such as VSS (for example, 0 volts) is applied to the gate electrode 56.

The voltages applied to the gate electrodes of the transmission gates respectively associated with the capacitors 44 through 46 of FIG. 2 are derived from three respective output leads emanating from a conventional decoder circuit 58. And the voltages applied to the gate electrodes of the transmission gates respectively associated with the n capacitors 48 . . . 50 . . . 52 are derived from the respective output leads of a standard n-bit shift register 60.

More specifically, again considering, for example, the transmission gate 54 associated with the capacitor 48, it is seen that the left-most output lead 61 of the shift register 60 is connected directly to the gate electrode 55 of the n-channel device in the transmission gate 54. On the other hand, a conventional inverter 62 is interposed between the output lead 61 and the gate electrode 56 of the p-channel device in the transmission gate 54.

Herein, it will be assumed that the voltage appearing on each output lead of the decoder circuit 58 and of the shift register 60 is either VDD (a relatively positive voltage representative of a binary "1" value) or VSS (a relatively negative voltage representative of a binary "0" value). Thus, when a "1" signal appears on one of these leads, the respective transmission gate connected thereto will be activated, whereas when a "0" signal appears on one of these leads, the respective transmission gate connected thereto will be deactivated.

Thus, for example, when a "1" signal (VDD) appears on the output lead 61 of the shift register 60 (FIG. 2), this signal will cause the n-channel device in the transmission gate 54 to conduct. At the same time, the "1" signal on the lead 61 is inverted to a "0" (VSS) by the inverter 62 and applied to the gate electrode 56 to cause the p-channel device in the transmission gate to also conduct.

On the other hand, when a "0" signal appears on the output lead 61 of the shift register 60, this causes the n-channel device in the transmission gate 54 to be rendered nonconductive. Further, the "0" output signal is inverted to a "1" by the inverter 62 and applied to the gate electrode 56 to cause the p-channel device in the gate 54 to also be rendered nonconductive.

It is generally advantageous to design the correction circuit 34 of FIG. 2 to be able to both add and subtract capacitance to the node point 12. In that way, the circuit 34 can automatically correct for frequency deviations that extend both above and below a prescribed frequency value. To establish a basis therefor, the circuit 34 is advantageously initialized to a condition in which some portion of the total capacitance represented by the capacitor array therein is connected at the outset of operation to the node point 12. Thus, for example, in response to signals applied to the circuit 34 via the lead 40 from control circuit 21, a conventional initialization circuit 64 is designed to set a specified number of the stages of the shift register 60 to their "1" states.

Assume, for example, that the circuit 64 is designed to initially set thirty-two of the shift register stages to their "1" states. As a result, thirty-two of the output leads emanating from the shift register 60 will initially have "1" signals thereon, whereby the respective transmission gates connected to these output leads will be activated and the associated thirty-two 4-pF capacitors will accordingly initially be connected via the lead 42 to the node point 12.

In the particular example assumed above, 4×32 or 128 pF of capacitance are initially connected to the node point 12 of FIG. 1 by the correction circuit 34 of FIG. 2. This capacitance thus adds to the equivalent capacitance represented by the capacitor 18 (FIG. 1) to provide a total initial value of capacitance in the series-resonant path of the oscillator circuit 10. In one specific case wherein the value of the capacitor 18 was 200 pF, the total capacitance of the series-resonant path was accordingly 228 pF. Such a total capacitance value in series with an inductor 11 having a value of 430 nH is designed to cause the circuit 10 to oscillate at a prescribed frequency of sixteen MHz.

In practice, it is generally advantageous to add or subtract capacitors to the node point 12 when the sine-wave signal provided by the oscillator circuit 10 has a value of either VSS or VDD. In the former case (VSS), each capacitor connected to the node point 12 should have zero charge stored thereon at the moment of connection. Similarly, in the latter case (VDD), each capacitor connected to the node point 12 should be charged to VDD at the moment of connection.

One illustrative way of insuring that each capacitor has zero charge thereon at the time of being connected to the node point 12 is depicted in FIG. 2. This is accomplished by an n-channel MOS transistor device 64 having its source-to-drain path connected in parallel with the capacitor 44. Assume, for example, that the output applied by the decoder circuit 58 to the left-hand output lead 66 is a "0" signal (VSS). This relatively low-level voltage is inverted by inverter 68 to produce a "1" or relatively high-level voltage and applied to the gate electrode of the n-channel device 64. In response thereto, the device 64 is activated, whereby a short-circuit is in effect connected in parallel with the capacitor 44. This insures that, during the time in which the capacitor 44 is not connected to the node point 12, no charge exists on the capacitor 44.

Subsequently, when the capacitor 44 is to be connected to the node point 12, the output lead 66 of the decoder circuit 58 has a "1" signal applied thereto. In the manner described earlier above, such a "1" signal is effective to activate the transmission gate 70 and thereby connect the capacitor 44 to the node point 12. Concurrently therewith, the "1" signal on the lead 66 is inverted by the inverter 68 and applied to the gate electrode of the n-channel device 64 to turn it off, whereby the capacitor 44 is no longer short-circuited.

Alternatively, to insure that each capacitor is charged to VDD at the time of being connected to the node point 12, a different illustrative arrangement is utilized. Thus, instead of the n-channel device 64, a p-channel MOS transistor device 72 is connected to the capacitor 44. Specifically, as indicated by dash-line connections in FIG. 2, the source-to-drain path of the p-channel device 72 is connected between VDD and the top plate of the capacitor 44. And the gate electrode of the device 72 is directly connected to the output lead 66 of the decoder circuit 58. Thus, as long as the lead 66 has a "0" (VSS) signal thereon, the p-channel device 72 is activated and VDD is applied to the capacitor 44 to charge it to that level. When a "1" signal appears on the lead 66, indicating that the capacitor 44 is to be connected to the node point 12, the p-channel device 72 is deactivated, whereby the capacitor 44 (which is charged to VDD) is disconnected from the VDD source.

Thus, it is advantageous that each of the capacitors of the array in the correction circuit 34 have either an n-channel or a p-channel device connected thereto, as described above and as shown in solid lines for the n-channel device 64 and in dash lines for the p-channel device 72 associated with the capacitor 44. So as not to unduly clutter FIG. 2, each of the other capacitors 45, 46, 48 . . . 50 . . . 52 included therein is not explicitly shown as having such a device connected thereto. But, as indicated by a short line and dashes extending to the top plate of each of the depicted capacitors, each of the capacitors of the array does in practice advantageously have such an additional device connected to the top plate thereof. In each case, the additional device is connected to its respective capacitor in exactly the same manner as either the device 64 or the device 72 is connected to the capacitor 44.

To insure reliable operation of the correction circuit 34 of FIG. 2, it is also advantageous to design the RC time constants of all the capacitor-containing paths that are connectable to the lead 42 to be approximately the same. Thus, since the capacitors 48 . . . 50 . . . 52 each have four times the capacitance of the capacitors 44 through 46, the transmission gates respectively connected to the capacitors 48 . . . 50 . . . 52 should each have gate widths about four times greater than the gate widths of the transmission gates respectively connected to the capacitors 44 through 46. And to minimize losses in the series-resonant path of the oscillator circuit 10, even the relatively small gates associated with the capacitors 44 through 46 should preferably be sized to exhibit a relatively low resistance when activated. In practice, MOS devices having, for example, gate widths of about ten micrometers for an n-channel device and twenty micrometers for a p-channel device are utilized to make such low-resistance transmission gates connected to the capacitors 44 through 46.

The correction circuit 34 shown in FIG. 2 also includes a conventional two-bit counter 74. The counter 74 is designed to respond to each concurrent application thereto of clock and relatively positive correction signals to count up by one and to respond to each concurrent application thereto of clock and relatively negative correction signals to count down by one. Thus, for example, assume that the counter 74 is initially set to a count of zero. In that case, the voltage levels appearing on output leads 76 and 77 of the counter are respectively representative of "0" and "0". This 00 representation is depicted in FIG. 3 wherein the voltage levels on the leads 76 and 77 in the time interval t0-to-t1 are both indicated as being relatively low.

Figure 3:
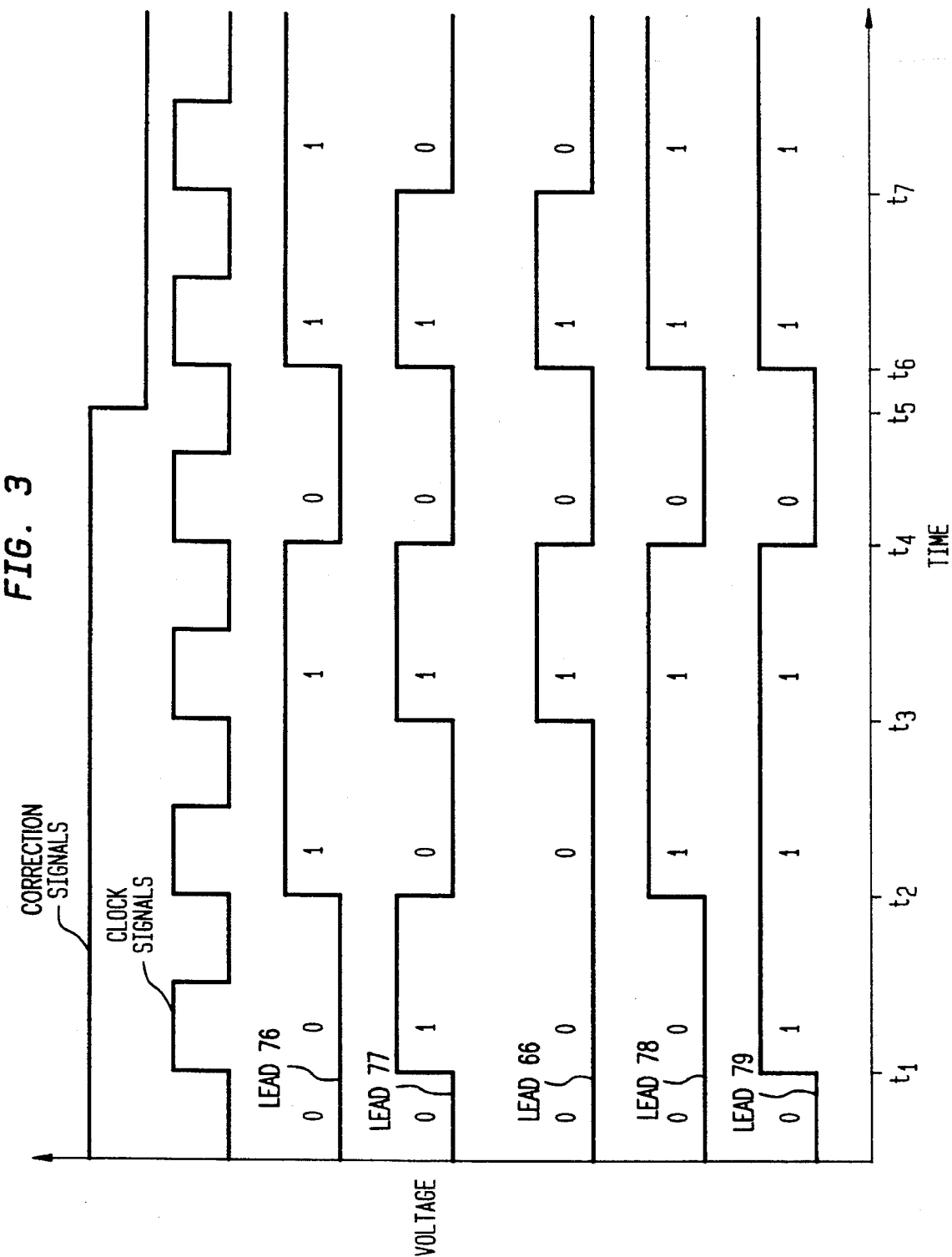
FIG. 3 is a timing diagram that is helpful in explaining the operation of the arrangements depicted in FIGS. 1 and 2.

Subsequent to t1 (FIG. 3), in response to the concurrent application to the counter 74 (FIG. 2) of a positive-going clock signal and a positive-level correction signal (indicative of the frequency of the output signal provided by the oscillator circuit 10 being above sixteen MHz), the counter 74 counts up by one, whereby, as represented in FIG. 3, the voltage levels on the output leads 76 and 77 then assume the values "0" and "1", respectively. This 01 representation on those leads is indicated in FIG. 3 in the time interval t1-to-t2.

Similarly, subsequent to t2, in response to a continuing positive-level (up-count) correction signal, the output of the two-bit counter 74 responds to three successive clock signals that respectively commence at t2, t3 and t4 to cycle up in count through the output representations 10, 11 and 00, which successively appear on the output leads 76 and 77, as indicated in FIG. 3. At t5, the correction signal applied to the counter 74 assumes its relatively negative value, indicative of the output frequency of the oscillator circuit 10 having decreased to a value below sixteen MHz. Accordingly, at t6, when the next clock signal commences, the counter 74 responds thereto by cycling down one count from the output representation 00 to the output representation 11. Finally, subsequent to t7, the counter 74 responds to the continuing negative-level (down-count) correction signal applied thereto from the phase comparator 26 to cycle down another count to the output representation 10, as indicated in FIG. 3.

The description herein indicates the manner in which automatic correction occurs in response to either a positive or negative correction signal. As the particular desired frequency is approached, the correction signal will in effect toggle the frequency of the oscillator circuit in response to each clock signal.

The two-bit output of the counter 74 appearing on the leads 76 and 77 is applied to the decoder circuit 58. The circuit 58 has three output leads 66, 78 and 79. The circuit 58 is designed to convert each two-bit input into a corresponding three-bit output. Specifically, as the output of the counter 74 cycles up through the sequences 00, 01, 10, 11 and 00 represented in FIG. 3, the decoder circuit 58 is designed to provide on the output leads 66, 78 and 79 the following three-bit sequences: 000, 001, 011, 111 and 000, respectively, as indicated in FIG. 3. Similarly, as the counter output cycles down through the sequences 11 and 10, the decoder circuit 58 responds thereto by providing on its output leads the three-bit sequences 111 and 011, as shown in FIG. 3.

In turn, the output of the decoder circuit 58 controls which capacitors of the indicated fine-adjustment array are in effect added to or subtracted from the capacitance value initially established by the correction circuit 34. The particular manner in which this is done is described in detail below.

Assume, for example, that at t0 (FIG. 3), a prespecified amount of capacitance consisting only of a particular set of capacitors from the coarse-adjustment array of capacitors 48 . . . 50 . . . 52 is connected to the lead 42 of FIG. 2. At that time, the output of the counter 74 is 00 and the output of the decoder circuit 58 is therefore 000. As a result, none of the capacitors 44 through 46 in the fine-adjustment array is connected to the lead 42 at that time.

Subsequent to t1 (FIG. 3), and in response to the frequency of the output of the oscillator circuit 10 being detected by the phase comparator 26 to be higher than its prescribed frequency, the output of the decoder circuit becomes 001, as previously described, whereby the capacitor 46 is connected to the lead 42. This increases the capacitance connected to the node point 12 and hence decreases the frequency of the series-resonant path of the oscillator circuit 10. Similarly, subsequent to t2, the output of the decoder circuit 58 becomes 011, whereby both of the capacitors 45 and 46 are connected to the lead 42. As a result, the output frequency of the oscillator circuit 10 is caused to decrease further.

Next, subsequent to t3, the output of the decoder circuit 58 becomes 111, whereby all three of the capacitors 44 through 46 are connected to the lead 42. This causes a still further decrease in the output frequency of the sine-wave signal provided by the oscillator circuit 10.

Subsequent to tpb 4, in response to another positive-level correction signal, the output of the decoder circuit 58 is cycled to its 000 condition. In effect, this causes the three one-pF capacitors 44 through 46 to be disconnected from the lead 42. At the same time, however, a conventional detector circuit 80 is designed to respond to the transition of the decoder output from 111 to 000 to apply a signal to the shift register 60 to set an additional stage thereof to its "1" state. Accordingly, while the three one-pF capacitors 44 through 46 are being disconnected from the lead 42, an additional one of the four-pF capacitors 48 . . . 50 . . . 52 is being connected to the lead 42. The net increase in capacitance connected to the node point 12 is thus one pF, which causes a still further decrease in the output frequency of the sine-wave signal provided by the oscillator circuit 10.

At t5 (FIG. 3), the correction signal provided by the comparator 26 of FIG. 1 goes negative, which is indicative of the output frequency of the oscillator circuit 10 falling below its prescribed value. Thus, subsequent to t6, the output of the decoder circuit 58 becomes 111, as indicated in FIG. 3. In turn, this reconnects the capacitors 44 through 46 to the lead 42. At the same time, however, the circuit 80 is designed to detect the transition of the output of the circuit 58 from 000 to 111 and in response thereto to set an additional stage of the shift register 60 to its "0" state. Accordingly, while the three one-pF capacitors 44 through 46 are being reconnected to the lead 42, one of the four-pF capacitors 48 . . . 50 . . . 52 previously connected to the lead 42 is being disconnected therefrom. The net decrease in capacitance connected to the node point 12 is thus one pF, which causes the desired result, namely, an increase in the output frequency of the oscillator circuit 10.

In the specific illustrative manner described above, capacitance is automatically added to or subtracted from the node point 12 one pF at a time to establish and maintain the output frequency of the oscillator circuit 10 in close tracking relationship with the frequency determined by the master timing circuit 24. Illustratively, by utilizing the particular closed-loop arrangement specified herein, the capacitance value in the series-resonant path of the oscillator circuit 10 can be electrically controlled in practice to maintain the output frequency of the circuit 10 at sixteen MHz plus or minus fifteen kilohertz.

Finally, it is to be understood that the above-described arrangements are only illustrative of the principles of the present invention. In accordance with these principles, numerous modifications and alternatives may be devised by those skilled in the art without departing from the spirit and scope of the invention.

What is claimed is:

1. A system for controlling the output frequency of an oscillator circuit that includes a resonant path comprising an inductor in series with a capacitor and having an output node in the series path between said inductor and said capacitor, said system comprising first means responsive to the output of said oscillator circuit and to the output of a master timing circuit for generating correction signals indicative of whether the output frequency of said oscillator circuit is above or below a reference frequency determined by the output frequency of said master timing circuit, and second means responsive to said correction signals for electrically connecting or disconnecting capacitors to said node point and in parallel with the capacitor in said series-resonant path to cause the output frequency of said oscillator circuit to track said reference frequency, wherein said second means includes means connected to each of said capacitors that is to be connected to or disconnected from said node point for establishing a predetermined charge condition thereon prior to the time that one of said capacitors is connected to said node point.

2. A system as in claim 1 wherein said first means comprises a phase comparator.

3. A system as in claim 2 wherein said phase comparator provides correction signals having one value when the output frequency of said oscillator circuit is above the reference frequency and having a different value when the output frequency of said oscillator circuit is below the reference frequency.

4. A system as in claim 3 wherein said second means comprises a two-bit counter having two output leads, said counter being responsive to correction signals of said one value for counting up by providing on its output leads a count that follows the sequence 00, 01, 10, 11 and 00 for successive up-count signals and responsive to correction signals of said different value for counting down by providing on its output leads a count that follows the sequence 00, 11, 10, 01 and 00 for successive down-count signals, a decoder circuit responsive to signals appearing on the output leads of said counter, said decoder circuit having three output leads and being responsive to counter outputs of 00, 01, 10 and 11 to provide respective outputs of 000, 001, 011 and 111, three capacitors each having a value of x Farads respectively associated with the output leads of said decoder circuit and each adapted to be connected to said node point and in parallel with the capacitor in the series-resonant path of said oscillator circuit, and means responsive to a "1" signal appearing on an output lead of said decoder circuit for connecting the capacitor respectively associated with that lead to said node point and responsive to a "0" signal on an output lead of said decoder circuit for disconnecting the capacitor respectively associated with that lead from said node point.

5. A system as in claim 4 wherein said second means further includes an n-bit shift register having n stages and n output leads emanating respectively from the stages of said register, n capacitors each having a value of 4x Farads respectively associated with the output leads of said shift register and each adapted to be connected to said node point and in parallel with the capacitor in the series-resonant path of said oscillator circuit, and means responsive to a "1" signal appearing on an output lead of said shift register for connecting the capacitor respectively associated with that lead to said node point and responsive to a "0" signal on an output lead of said shift register for disconnecting the capacitor respectively associated with that lead from said node point.

6. A system as in claim 5 wherein said second means still further includes a detector circuit responsive to the representation on the output leads of said decoder circuit going from 111 to 000 by inserting an additional "1" into the stages of said shift register and responsive to the representation on the output leads of said decoder circuit going from 000 to 111 by inserting an additional "0" into the stages of said shift register.

7. A system as in claim 6 wherein said second means still further includes means for initially setting a specified number of the stages of said shift register to their "1" states, whereby the capacitors respectively associated with the output leads emanating from stages that are in their "1" states are thereby initially connected to said node point and in parallel with the capacitor in the series-resonant path of said oscillator circuit.

8. A system as in claim 1 wherein said oscillator circuit provides a sine-wave output characterized by maximum-amplitude and zero-amplitude values, and wherein said means for establishing said predetermined charge condition establishes one of said values on each one of said capacitors to VDD prior to each such capacitor being connected to said node point.

9. A system as in claim 8 wherein said maximum-amplitude value is VDD, and wherein said means for establishing a predetermined charge condition charges each capacitor to VDD prior to the capacitor being connected to said node point.

10. A system as in claim 8 wherein said zero-amplitude value is VSS, and wherein said means for establishing said predetermined charge condition establishes zero charge on each one of said capacitors prior to each such capacitor being connected to said node point.

* * * * *